United States Patent
Kusukawa et al.

(10) Patent No.: US 6,791,182 B2
(45) Date of Patent: Sep. 14, 2004

(54) SEMICONDUCTOR DEVICE

(75) Inventors: Junpei Kusukawa, Hitachi (JP); Ryozo Takeuchi, Hitachi (JP); Toshiaki Ishii, Hitachi (JP); Hiromichi Suzuki, Tokyo (JP); Fujio Ito, Hanno (JP); Takafumi Nishita, Iruma (JP); Akihiko Kameoka, Ogose (JP); Masaru Yamada, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 33 days.

(21) Appl. No.: 10/103,799

(22) Filed: Mar. 25, 2002

(65) Prior Publication Data
US 2003/0042597 A1 Mar. 6, 2003

(30) Foreign Application Priority Data
Aug. 30, 2001 (JP) ........................ 2001-261824

(51) Int. Cl.$^7$ .................... H01L 23/10; H01L 23/34
(52) U.S. Cl. .................. 257/707; 257/706; 257/675; 257/677
(58) Field of Search ................... 257/666, 675, 257/606, 607, 677, 706, 707, 762, 787

(56) References Cited

U.S. PATENT DOCUMENTS

| 4,594,770 A | * | 6/1986 | Butt |
| 4,888,449 A | * | 12/1989 | Crane et al. |
| 5,650,663 A | * | 7/1997 | Parthasarathi |

FOREIGN PATENT DOCUMENTS

| JP | 8-204098 | 8/1996 |
| JP | 10-163410 | 6/1998 |

* cited by examiner

Primary Examiner—S. V. Clark
(74) Attorney, Agent, or Firm—Antonelli, Terry, Stout & Kraus, LLP

(57) ABSTRACT

At least a part of the inner leads 1*a* of a lead frame 1 is covered with a plating for a metallic fine wire connection, at least the entire portion where the lead frame 1 joins with the adhesive layer 2 is covered by at least one metal or alloy thereof different from the metallic fine wire connecting use plating. The metal or alloy is selected from the group consisting of gold, platinum, iridium, rhodium, palladium, ruthenium, indium, tin, molybdenum, tungsten, gallium, zinc, chromium, niobium, tantalum, titanium and zirconium. Thereby, generation of defects, such as leakage and shorting, due to ion migration can be prevented.

40 Claims, 12 Drawing Sheets

FIG. 7

| | COVER MATERIAL | COVER STRUCTURE | PEELING OF GENERATION NUMBER/SAMPLE NUMBER | | | | | SHORTING POOR NUMBER BETWEEN LEADS/ SAMPLE NUMBER | | | | | SHORTING POOR NUMBER BETWEEN LEAD AND HEAT RADIATION PLATE/ SAMPLE NUMBER | | | | |
|---|---|---|---|---|---|---|---|---|---|---|---|---|---|---|---|---|---|
| | | | 100h | 200h | 300h | 400h | 500h | 100h | 200h | 300h | 400h | 500h | 100h | 200h | 300h | 400h | 500h |
| EMBODIMENT 1 | Au | FIG. 1 | 0/20 | 7/20 | 11/20 | 15/20 | 16/20 | 0/20 | 0/20 | 0/20 | 0/20 | 0/20 | 0/20 | 0/20 | 2/20 | 4/20 | 5/20 |
| " 2 | Au | FIG. 2 | 0/20 | 6/20 | 9/20 | 12/20 | 14/20 | 0/20 | 0/20 | 0/20 | 0/20 | 0/20 | 0/20 | 0/20 | 1/20 | 4/20 | 5/20 |
| " 3 | Au | FIG. 3 | 0/20 | 6/20 | 10/20 | 14/20 | 17/20 | 0/20 | 4/20 | 6/20 | 9/20 | 12/20 | 0/20 | 0/20 | 2/20 | 4/20 | 4/20 |
| " 4 | Au | FIG. 4 | 0/20 | 5/20 | 9/20 | 13/20 | 18/20 | 0/20 | 3/20 | 7/20 | 9/20 | 13/20 | 0/20 | 0/20 | 1/20 | 3/20 | 5/20 |
| " 5 | Au | FIG. 5 | 0/20 | 4/20 | 9/20 | 12/20 | 15/20 | 0/20 | 0/20 | 0/20 | 0/20 | 0/20 | 0/20 | 0/20 | 0/20 | 0/20 | 0/20 |
| " 6 | Pt | FIG. 5 | 0/20 | 0/20 | 0/20 | 0/20 | 16/20 | 0/20 | 0/20 | 0/20 | 0/20 | 0/20 | 0/20 | 0/20 | 0/20 | 0/20 | 0/20 |
| " 7 | Rh | FIG. 5 | 0/20 | 2/20 | 6/20 | 8/20 | 9/20 | 0/20 | 0/20 | 0/20 | 0/20 | 0/20 | 0/20 | 0/20 | 0/20 | 0/20 | 0/20 |
| " 8 | Pd | FIG. 5 | 0/20 | 3/20 | 5/20 | 8/20 | 10/20 | 0/20 | 0/20 | 0/20 | 0/20 | 0/20 | 0/20 | 0/20 | 0/20 | 0/20 | 0/20 |
| " 9 | Sn | FIG. 5 | 0/20 | 0/20 | 0/20 | 3/20 | 7/20 | 0/20 | 0/20 | 0/20 | 0/20 | 0/20 | 0/20 | 0/20 | 0/20 | 0/20 | 0/20 |
| " 10 | Zn | FIG. 5 | 0/20 | 0/20 | 0/20 | 4/20 | 6/20 | 0/20 | 0/20 | 0/20 | 0/20 | 0/20 | 0/20 | 0/20 | 0/20 | 0/20 | 0/20 |
| " 11 | Cr | FIG. 5 | 0/20 | 0/20 | 0/20 | 0/20 | 4/20 | 0/20 | 0/20 | 0/20 | 0/20 | 0/20 | 0/20 | 0/20 | 0/20 | 0/20 | 0/20 |
| " 12 | Ni | FIG. 5 | 0/20 | 0/20 | 0/20 | 0/20 | 2/20 | 0/20 | 0/20 | 0/20 | 0/20 | 0/20 | 0/20 | 0/20 | 0/20 | 0/20 | 0/20 |
| " 13 | Ti | FIG. 5 | 0/20 | 0/20 | 0/20 | 0/20 | 3/20 | 0/20 | 0/20 | 0/20 | 0/20 | 0/20 | 0/20 | 0/20 | 0/20 | 0/20 | 0/20 |
| " 14 | POLYIMIDE | FIG. 6 | 0/20 | 6/20 | 12/20 | 15/20 | 17/20 | 0/20 | 0/20 | 0/20 | 0/20 | 0/20 | 0/20 | 0/20 | 0/20 | 0/20 | 0/20 |
| " 15 | NOCOVER | FIG. 20,21,22 | 0/20 | 2/20 | 15/20 | — | — | 0/20 | 4/20 | 8/20 | 11/20 | 14/20 | 0/20 | 2/20 | 5/20 | 9/20 | 11/20 |

SEMICONDUCTOR DEVICE

BACKGROUND OF THE INVENTION

The present invention relates to a resin molded type semiconductor device, which is assembled by making use of a lead frame with a heat radiation plate.

These days, significant advances are being made in higher integration and higher performance in semiconductor devices; and, in association therewith, the amount of heat generated in a semiconductor chip has tended to increase. In order to dissipate the heat generated by a semiconductor chip, copper or a copper alloy (small amount of such elements as Ag, Sn, Fe, Cr, Zn, Ni, Mg, P and Si is added for enhancing such characteristics as mechanical strength) having excellent heat conductivity is currently being used as the material of a lead frame in place of the conventionally used 42 alloy (42%Ni—Fe alloy).

Further, since the amount of heat generated in a microcomputer is particularly high, an efficient heat dissipation therefor is required; and, for this purpose, there is a package using a lead frame having a heat radiation plate, in which the heat radiation plate is connected via an adhesive layer to the lead frame, known as a HQFP (Quad Flat Package with Heat Sink).

FIG. 18 shows in a top plan view an example of a conventional HQFP; FIG. 19 shows a structural example of the conventional HQFP; and FIG. 20 shows in cross-section an inner plane view of the conventional HQFP. The conventional HQFP is generally assembled in the following manner.

At first, as seen in FIG. 19, a heat radiation plate 3, on which an adhesive layer 2, such as polyimide resin, is formed in advance, such as by coating, is secured to an inner lead portion 1a of a lead frame 1 after being joined, heat pressed and cured. Subsequently, a semiconductor chip 4 is adhered on the heat radiation plate 3 or on a die pad of the lead frame by an adhesive member 5, such as Ag paste.

Then, electrodes on the semiconductor chip and top ends of the inner lead are connected by metallic fine wires 6 made of a conductive material, such as gold. In this instance, at least on a portion where the metallic fine wire of the inner lead is connected, a plating 7 is frequently applied in advance to form a metallic fine wire connection using Ag, so as to obtain good connectability. Thereafter, the semiconductor chip 4, the metallic fine wire 6, the inner lead 1a and a part of the (or the entire) radiation plate 3 are covered by a molding resin 8, such as epoxy resin; and, finally, a portion of an outer lead 1b of the lead frame 1 is plated and then bent to form the outer lead 1b, whereby the device is completed after a marking is applied thereto.

Before shipping the semiconductor device to the market, a variety of reliability tests are performed thereon. Among these tests, there is a humidity acceleration test called a PCT (Pressure Cooker Test); and, when HQFP of conventional structure is subjected to such a PCT, problems tend to arise in that a deterioration phenomena, such as leakage and shorting, are caused about 200 hours after the start of the test. As a result of an analysis of the deterioration phenomena due to PCT by the inventors, it was found that the deteriorations are caused for reasons that will be explained below.

FIGS. 21 and 22 are cross-sectional views of a HQFP having a conventional structure, as seen along line A—A shown in FIG. 19, and the above-mentioned problems will be explained in detail with reference to FIGS. 21 and 22. FIG. 21 shows the cross-section before the device is subjected to a PCT, and FIG. 22 shows the cross-section after the PCT, in which the lead frame 1 is joined to the heat radiation plate 3 via the adhesive layer 2 and these elements are covered by the molding resin 8.

The PCT is performed at a high temperature of 121° C. Further, there are differences in the coefficients of thermal expansion of the respective materials. For example, the coefficient of thermal expansion of the molding resin 8 is 10–30 ppm/° C., the coefficient of the thermal expansion of copper or copper alloy of the lead frame 1 and heat radiation plate 3 is about 17 ppm/° C. and the coefficient of thermal expansion of the adhesive layer 3 is 30–40 ppm/° C. Thus, a first problem arises in that, after the PCT, as shown in FIG. 22, a peeling off portion 9 is produced at respective boundaries between the lead frame 1 and the adhesive layer 2 and between the molding resin 8 and the adhesive layer 2.

Further, when the peeling off portion 9 is produced at respective boundaries between the lead frame 1 and the adhesive layer 2 and between the molding resin 8 and the adhesive layer 2, since the PCT is performed under a severe condition of 121° C./100% RH/2 atm, moisture penetrates into the semiconductor device through the boundary between the lead frame 1 and the molding resin 8 or through the molding resin 8 itself, and the moisture collects inside the space created by the peeling off portion 9.

In regard to the moisture collected in the peeling off portion 9, components such as the molding resin 8, the adhesive layer 2 and the paste material 5 have been extracted, and it has been found that the collected moisture exhibits an acidic character. The extracted components are organic acid and chlorine ions contained in the molding material, or a component which changes the extracted liquid into acid. By this acidic solution, the copper or the copper alloy, which is the material of the lead frame 1, is eluted and ionized and is redeposited as deposited copper 10, thereby, a phenomenon (ion migration) arises that represents a second problem which results in a shorting between the leads.

Further, at the top end portion of the inner lead 1a where the plating 7, such as Ag, for connecting the metallic fine wire 6, the plating metal 7 and the copper or the copper alloy, which is the material of the lead frame 1, are exposed to the moisture at the same time, a galvanic cell is formed by the dissimilar metal junction, and so the above phenomenon is further accelerated.

FIGS. 23 and 24 show the area around the end portion (B portion) of the heat radiation plate 3 in the HQFP having a conventional structure, as shown in FIG. 19. FIG. 23 shows the B portion before the PCT, and FIG. 24 shows the B portion after the PCT, in which the lead frame 1 is joined to the heat radiation plate 3 via the adhesive layer 2 and these elements are molded by the molding resin 8.

Even at a heat radiation plate end portion 3a, the peeling off portion 9 is likely caused after the PCT, as shown in FIG. 24, and moisture accumulates at the peeling off portion 9. Due to the presence of this accumulated acidic water, the copper or the copper alloy, which is the material of the heat radiation plate 3, is eluted and ionized, and redeposited as the deposited copper 10, thereby, a problem of causing shorting between the lead frame 1 and the heat radiation plate 3 arises.

Further, JP-A-10-163410 (1998) proposes a technique for preventing ion migration preventing in a taping lead frame, in which a protective film is formed at a portion of a lead contacting an adhesive. However, an object of the technique disclosed in JP-A-10-163410 (1998) is to prevent copper diffusion movement through the adhesive in the taping lead frame caused by an electric field formed by voltage application, and so the structure of the concerned lead frame with the heat radiation plate and the semiconductor device, and the ion migration phenomenon are different.

Further, the ion migration of the copper diffusive movement through the adhesive is resolved by changing the adhesive material from a phenol resin series to a maleimide resin series and polyimide resin series, for example.

Further, JP-A-8-20498 (1996) proposes a lead frame with a heat radiation plate in which, in order to prevent electrical shorting between the lead frame and the heat radiation plate end portion due to the presence of a heat radiation plate punching burr, an insulative coating is provided for the lead frame at the face joining the adhesive layer, and the insulative coating is formed so as to protrude from the heat radiation plate end portion. However, with this measure, when peeling off is caused, the migration between leads and between a lead and a heat radiation plate can not be prevented. In particular, JP-A-8-204098 (1996) nowhere discloses migration between the leads. Accordingly, for example, when dealing with a narrow pitch type semiconductor device in which the interlead pitch is narrow, the technical countermeasure disclosed in JP-A-8-204098 (1996) is insufficient when applied to migration.

SUMMARY OF THE INVENTION

An object of the present invention is to solve the above-described first and second problems and to provide a semiconductor device which limits generation of peeling and cracks and prevents problems, such as leakage and shorting, due to ion migration, even when the peeling and cracks appear to some extent.

The above and other objects and novel features of the present invention will become apparent from the description provided in the present specification and from the attached drawings.

Among aspects and features of the invention disclosed in the present application, an outline of typical ones will be briefly explained hereinbelow.

Namely, a semiconductor device according to one aspect of the present invention comprises a plurality of inner leads, which are made of copper or a copper alloy and extend around a semiconductor chip; a heat radiation plate which is joined to one end of the plurality of inner leads via an insulative adhesive layer and on which the semiconductor chip is mounted via the adhesive layer or an adhesive different from the adhesive layer; a plurality of metallic fine wires which connect between the semiconductor chip and the plurality of inner leads, respectively; and, a molding resin which molds the semiconductor chip, the plurality of metallic fine wires and the heat radiation plate, wherein a portion of the inner leads which joins with the adhesive layer is covered by a metal having a higher reference electrode potential than that of copper.

Further, in a semiconductor device according to another aspect of the present invention, wherein a lead frame and a heat radiation plate, which are made of copper or copper alloy, are joined by an adhesive layer formed on a surface of the heat radiation plate, the device is assembled by making use of the lead frame with the heat radiation plate. In addition, at least a part of the inner leads are provided with a metallic fine wire connection plating, and at least the entire portion where the lead frame joins the adhesive layer is covered by at least one metal or alloy different from the material of the metallic fine wire connecting plating. For example, such metal or alloy is selected from the group consisting of gold, platinum, iridium, rhodium, palladium, ruthenium, indium, tin, molybdenum, tungsten, gallium, zinc, chromium, niobium, tantalum and titanium.

BRIEF DESCRIPTION OF THE DRAWINGS

FIG. 7 is a table showing humidity resistance evaluation of embodiments 1–14 and a comparative example (FIGS. 20 and 21) obtained by a PCT (Pressure Cooker Test);

DETAILED DESCRIPTION OF THE PREFERRED EMBODIMENTS

Hereinbelow, embodiments of the present invention will be described in detail with reference to the drawings. At first embodiments 1 through 14 will be considered. For the convenience of explanation, a comparative example will be described initially for clearly setting forth the advantages of the embodiments 1 through 14; subsequently, the embodiments 1–8 which resolve the second problem dealt with by the present invention will be described; then, the embodiments 9 through 14 which resolve the first problem dealt with by the invention will be described; and, finally, the overall advantages of the embodiments 1 through 14 will be explained with reference to the "humidity resistance evaluation results" shown in FIG. 7.

COMPARATIVE EXAMPLES

Figure 1:
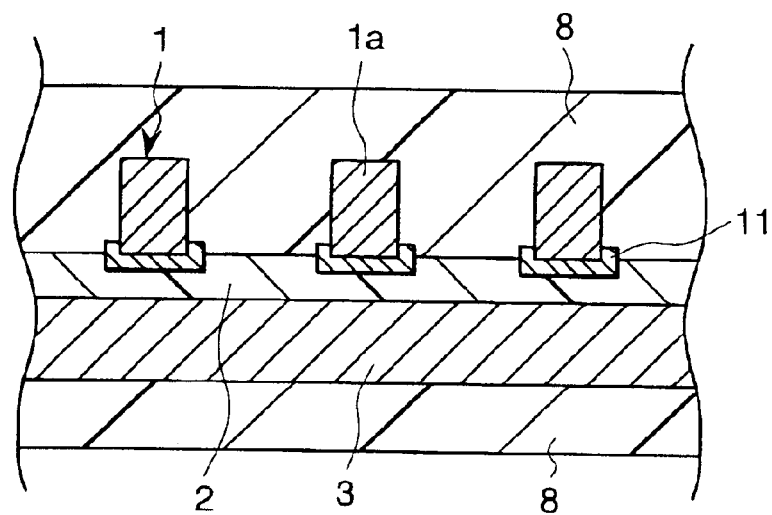
FIG. 1 is an enlarged partial cross-sectional view as seen along line C—C in FIG. 9, showing an example of a semiconductor device (HQFP) representing embodiment 1 of the present invention.
Figure 21:
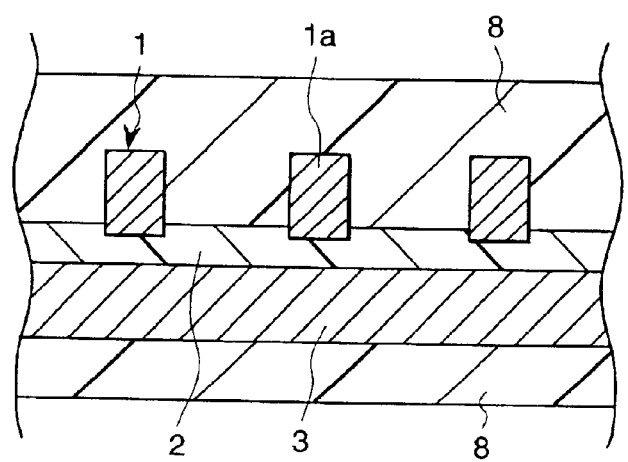
FIG. 21 is an enlarged partial cross-sectional view taken along line A—A in FIG. 19.
Figure 22:
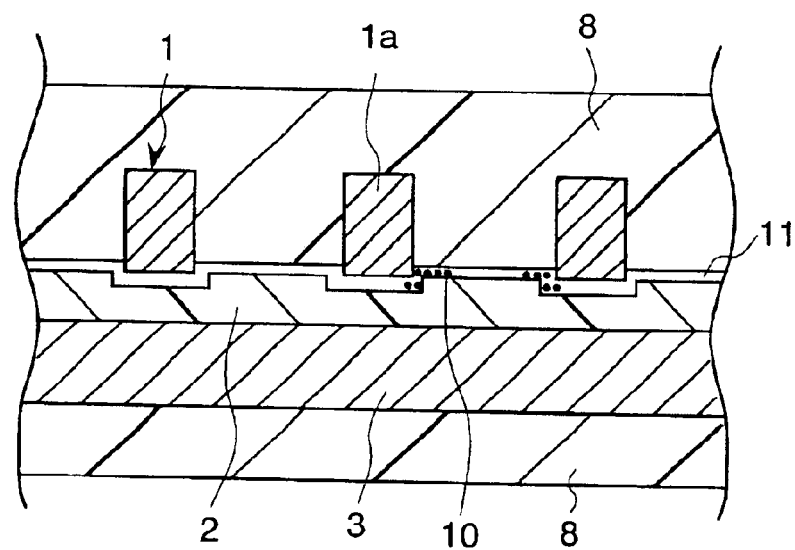
FIG. 22 is an enlarged partial cross-sectional view showing the structure of the cross section of FIG. 21 after a PCT.
Figure 23:
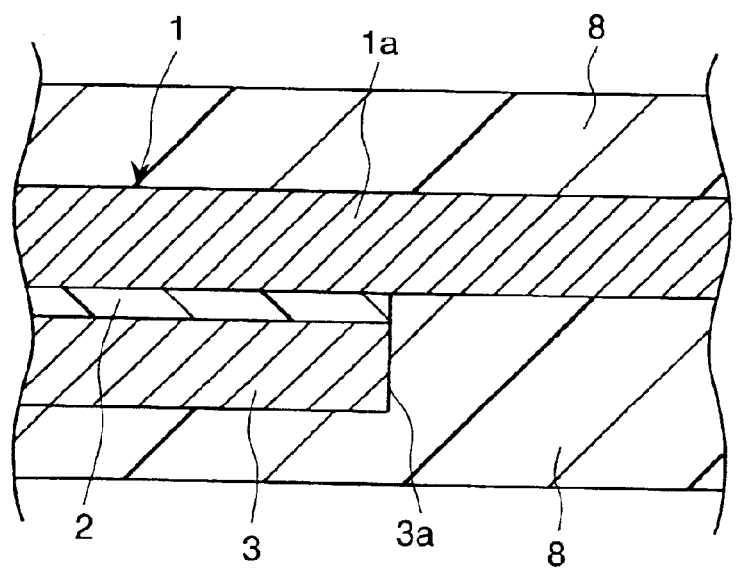
FIG. 23 is an enlarged partial cross-sectional view showing a portion (B portion) around the end portion of the heat radiation plate in FIG. 19.
Figure 24:
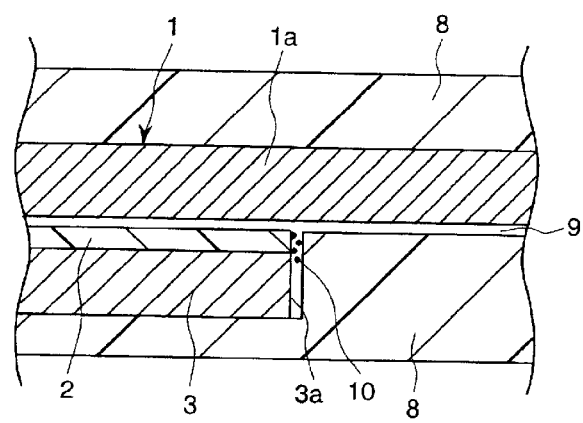
FIG. 24 is an enlarged partial cross-sectional view showing the cross section as shown in FIG. 23 after a PCT.

As comparative examples for demonstrating the advantages of the embodiments 1 through 14, which will be explained later, reference will be made to the conventional examples of semiconductor devices shown in FIGS. 21 and 23. In FIG. 21, there is no metallic coating 11, as shown in FIG. 1, formed by a process such as plating, at the junction portion between a lead frame 1 and an adhesive layer 2, and so the copper or copper alloy, which is a material used for the lead frame 1, is left in an exposed state; and, in FIG. 23 there is no metallic coating 11, as shown in FIG. 1, formed by a process such as by plating at a heat radiation plate end portion 3a, and so the copper or copper alloy, which is a material used for the heat radiation plate 3, is left in an exposed state.

Embodiment 1

Figure 8:
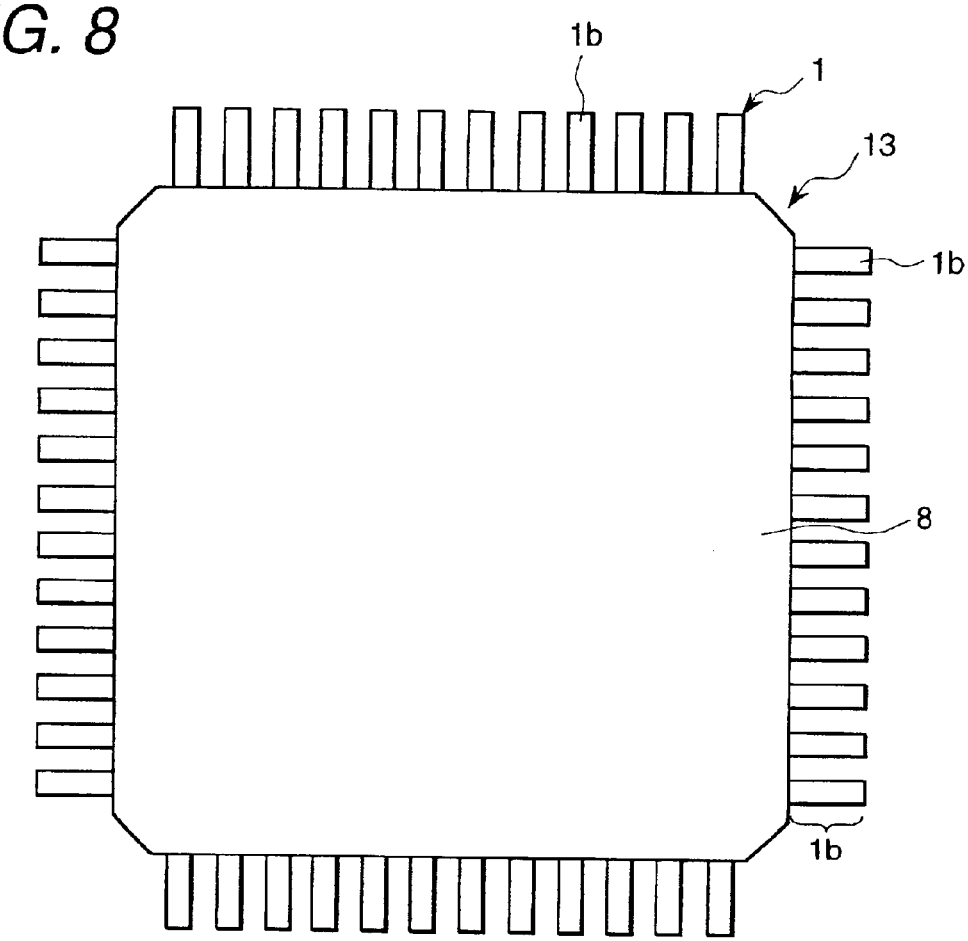
FIG. 8 is a top plan view showing an example of a semiconductor device (HQFP) according to the present invention.
Figure 9:
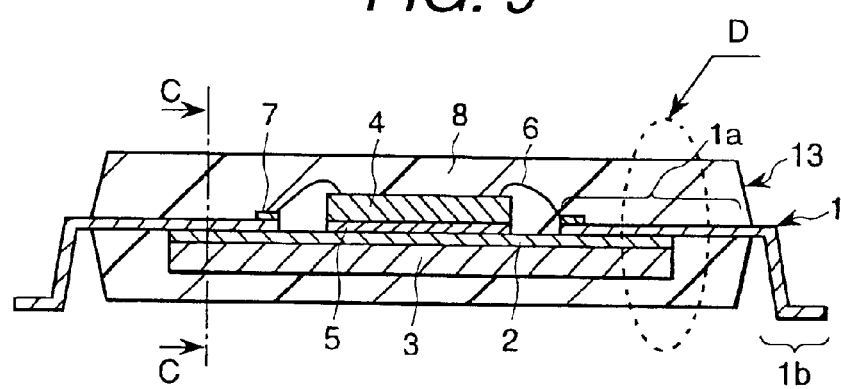
FIG. 9 is a cross-sectional view showing the structure of the semiconductor device shown in FIG. 8.

At first, the structure of the HQFP 13, as shown in FIGS. 8 and 9, will be explained as an example of a semiconductor device configured according to the present invention. The device is constituted by a semiconductor chip 4 on which semiconductor integrated circuits are formed; a plurality of inner leads constituted by copper or a copper alloy and disposed so as to extend around the semiconductor chip 4; a heat radiation plate 3 constituted by copper or a copper alloy and joined with one end (chip side end portion) of the plurality of inner leads 1a via the insulative adhesive layer 2, and on which the semiconductor chip 4 is mounted via the adhesive layer 2 or an adhesive member (adhesive) 5; a plurality of metallic fine wires which connect the semiconductor chip 4 with respective inner leads 1a; a molding resin 8 which covers the semiconductor chip 4, the plurality of metallic fine wires 6 and the heat radiation plate 3; and, a plurality of outer leads 1b, which are formed integral with the respective inner leads 1a and are disposed outside of the molding resin 8, while being bent in a gull wing shape. Although not shown in FIGS. 8 and 9, metallic coatings 11 are formed at portions where the plurality of inner leads 1a are joined with the respective adhesive layer 2.

Figure 10:
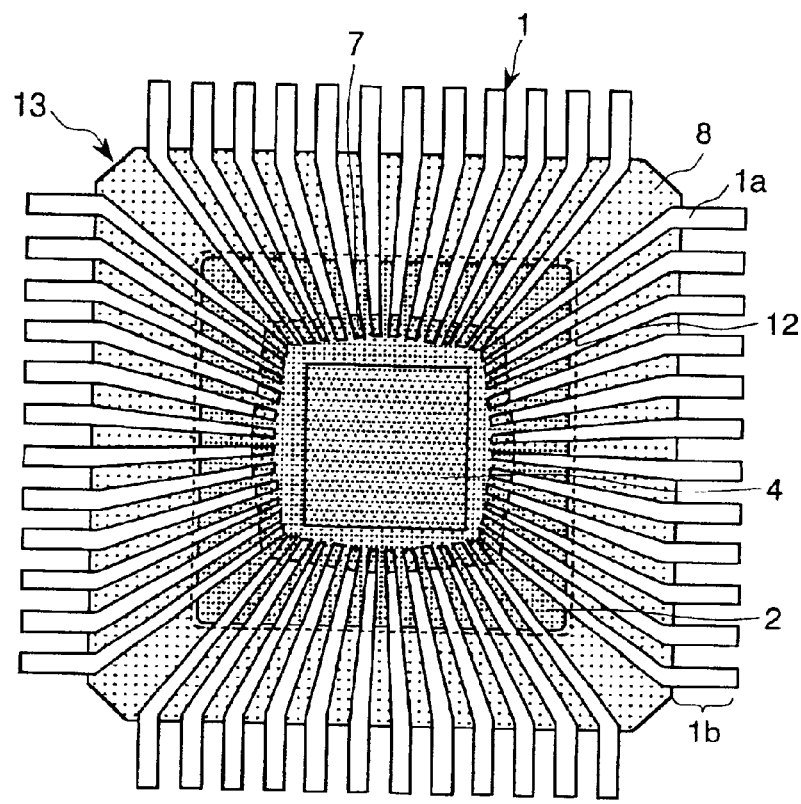
FIG. 10 is a sectional view showing an inner structure of the semiconductor device (HQFP) shown in FIG. 8.

The region where the metallic coatings 11 are formed at the respective inner leads 1a is a metallic coating region 12, as shown in FIG. 10, which covers all of the regions where boundaries are formed between the molding resin 8, inner leads 1a and the adhesive layer 2, and in which peeling off is possibly caused; and, the metallic coating 11 covers a region on the respective inner leads joined with the adhesive layer 2 which is disposed slightly outward from the chip side end portions.

Further, on the respective inner leads 1a, at the connecting portions with the metallic fine wires 6, Ag platings 7 are used for securing a good connection with the metallic fine wires 6. Further, the semiconductor chip 4 is secured on the adhesive layer 2 by the adhesive member 5, such as Ag paste.

Herein, FIG. 1 is a cross-sectional view of a semiconductor device representing embodiment 1 according to the present invention, which makes use of a lead frame with a heat radiation plate as seen in FIG. 9. As shown in FIG. 1, by applying Au plating over all of the portions of the lead frame 1 which come into contact with the adhesive layer 2, the metallic coating 11 is formed. For the plating, any method, such as electro-plating and electro less plating, can be used. Further, the metal coating 11 can be formed other than by plating, such as by physical vapor deposition, including vacuum evaporation, spattering and ion plating, and by chemical vapor deposition.

After forming the metallic coating, the heat radiation plate 3, on which the adhesive layer 2 is formed beforehand, is adhered to the lead frame 1, to thereby obtain a lead frame with a heat radiation plate. Assembly of the semiconductor device thereafter is performed according to conventional processes.

Namely, after preparing the lead frame with a heat radiation plate, the semiconductor chip 4 is die-bonded via the adhesive member 5 on the adhesive layer 2 of the heat radiation plate 3, serving as a die pad (chip mounting portion) for the lead frame with a heat radiation plate, and thereafter, the semiconductor chip 4 is wire-bonded to the respective inner leads 1a by way of the metallic fine wires 6.

Subsequently, the outer leads 1b are cut and then bent in a gull wing shape to complete the assembling of the HQFP 13.

Embodiment 2

Figure 2:
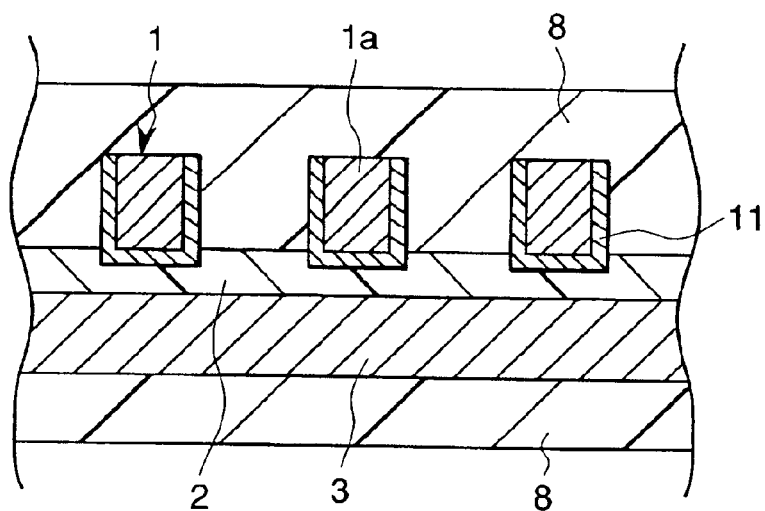
FIG. 2 is an enlarged partial cross-sectional view as seen along line C—C in FIG. 9, showing an example of a semiconductor device (HQFP) representing embodiment 2 of the present invention.

FIG. 2 is a cross-sectional view of a semiconductor device representing embodiment 2 according to the present invention, which makes use of a lead frame with a heat radiation plate as shown in FIG. 9. As shown in FIG. 2, by applying Au plating over all of the bottom and both sides of the lead frame 1, which is to be joined with the adhesive layer 2, the metallic coating 11 is formed. After forming the metallic coating, the heat radiation plate 3, on which the adhesive layer 2 is formed beforehand, is adhered to the lead frame 1, to thereby obtain a lead frame with a heat radiation plate. Assembly of the semiconductor device thereafter is performed according to conventional processes.

Embodiment 3

Figure 3:
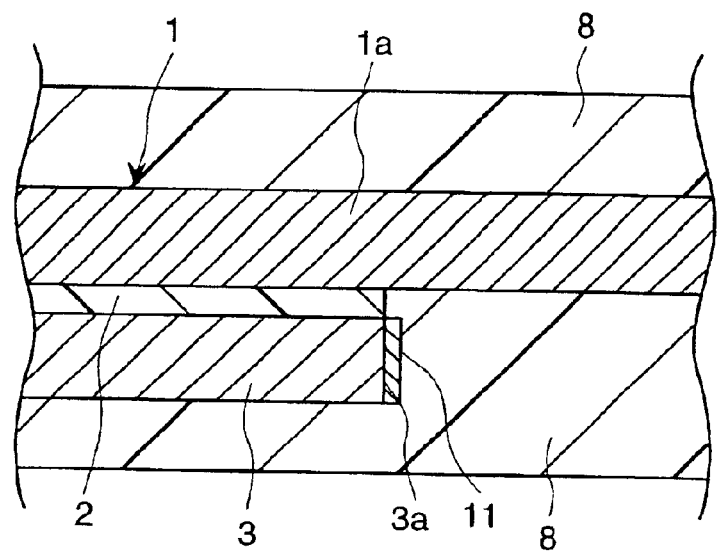
FIG. 3 is an enlarged partial cross-sectional view of the portion D in FIG. 9, showing an example of a semiconductor device (HQFP) representing embodiment 3 of the present invention.

FIG. 3 is a cross-sectional view of the area of the heat radiation plate end portion of a semiconductor device representing embodiment 3 according to the present invention, which makes use of a lead frame with a heat radiation plate as seen in FIG. 9. As shown in FIG. 3, by applying Au plating over the heat radiation plate end portion 3a beforehand, the metallic coating 11 is formed. After forming the metallic coating, the heat radiation plate 3, on which the adhesive layer 2 is formed beforehand, is adhered to the lead frame 1, to thereby obtain a lead frame with a heat radiation plate. Assembly of the semiconductor device thereafter is performed according to conventional processes.

Embodiment 4

Figure 4:
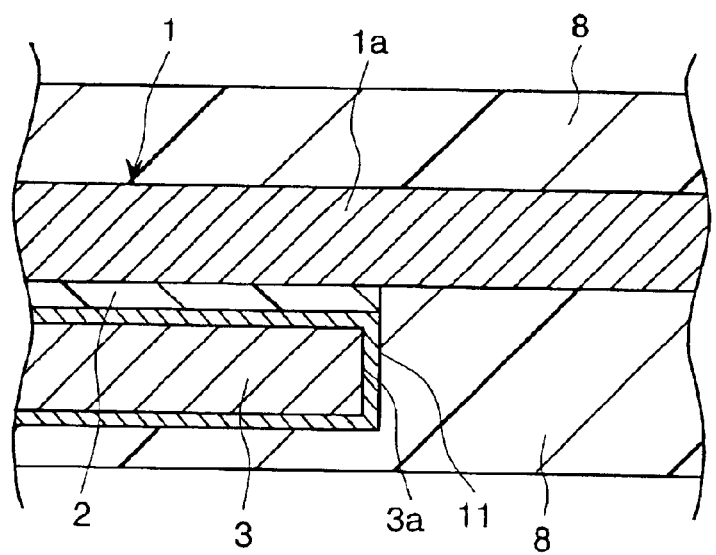
FIG. 4 is an enlarged partial cross-sectional view of the portion D in FIG. 9, showing an example of a semiconductor device (HQFP) representing embodiment 4 of the present invention.

FIG. 4 is a cross-sectional view of the area of the heat radiation plate end portion of a semiconductor device representing embodiment 3 according to the present invention, which makes use of a lead frame with a heat radiation plate as seen in FIG. 9. As shown in FIG. 4, by applying Au plating over the entire circumference of the heat radiation plate 3 beforehand, the metallic coating 11 is formed. After forming the metallic coating, the adhesive layer 2 is formed on one surface of the heat radiation plate 3, and, thereafter, the same is adhered to the lead frame 1, to thereby obtain a lead frame with a heat radiation plate. Assembly of the semiconductor device thereafter is performed according to conventional processes.

Embodiment 5

Figure 5:
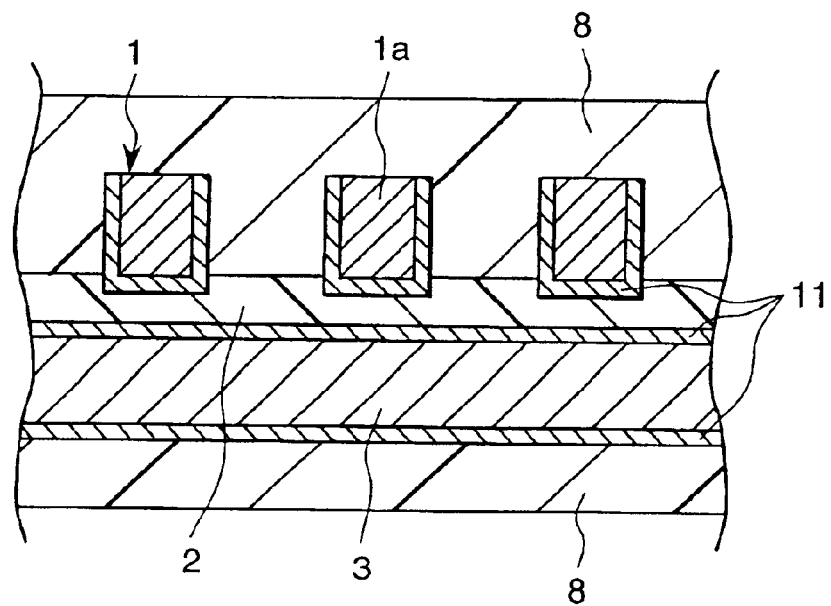
FIG. 5 is an enlarged partial cross-sectional view as seen along line C—C in FIG. 9, showing an example of a semiconductor device (HQFP) representing embodiments 5–13 of the present invention.

FIG. 5 is a cross-sectional view of a semiconductor device representing embodiment 5 according to the present invention, which makes use of a lead frame with a heat radiation plate as shown in FIG. 9. As shown in FIG. 5, by applying Au plating over all of the bottom and both sides of the lead frame 1, which is to be joined with the adhesive layer 2, as well as on the entire circumference of the heat radiation plate 3, the metallic coating 11 is formed. After forming the metallic coating, on one surface of the heat radiation plate 3 the adhesive layer 2 is formed, and, thereafter the same is adhered to the lead frame 1, to thereby obtain a lead frame with a heat radiation plate. Assembly of the semiconductor device thereafter is performed according to conventional processes.

Embodiments 6–13

The structures of these embodiments are the same as that of FIG. 5 (embodiment 5), however, as opposed to embodiment 5, wherein Au plating is applied, the entire bottom and both sides of the lead frame 1, which is joined to the adhesive layer 2, and the entire circumference of the heat radiation plate 3 are covered, as seen in FIG. 5, by Pt plating (Embodiment 6), Rh plating (Embodiment 7), Pd plating (Embodiment 8), Sn plating (Embodiment 9), Zn plating (Embodiment 10), Cr plating (Embodiment 11), Ni plating (Embodiment 12) and Ti plating (Embodiment 13), whereby, the metal coating 11 is formed After forming the metallic coating, the adhesive layer 2 is formed on one surface of the heat radiation plate 3, and, thereafter, the same is adhered to the lead frame 1 to thereby obtain a lead frame with a heat radiation plate. Assembly of the semiconductor device thereafter is performed according to conventional processes.

Embodiment 14

Figure 6:
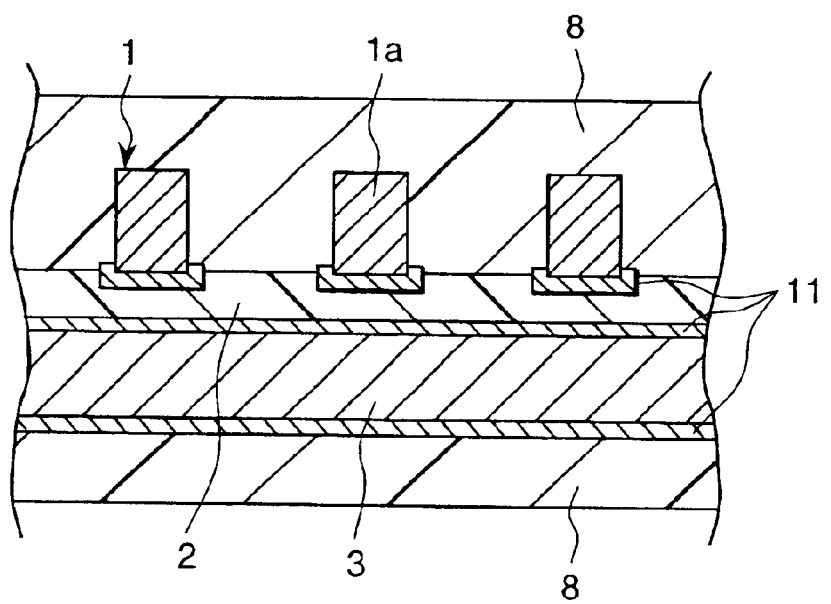
FIG. 6 is an enlarged partial cross-sectional view as seen along line C—C in FIG. 9, showing an example of a semiconductor device (HQFP) representing embodiment 14 of the present invention.

FIG. 6 is a cross-sectional view of a semiconductor device representing embodiment 14 according to the present invention, which makes use of a lead frame with a heat radiation plate as shown in FIG. 9. As shown in FIG. 6, by applying polyimide resin vanish over all of the portions of the lead frame 1 which are to be joined with the adhesive layer 2, as well as and the entire circumference of the heat radiation plate 3, and after drying the same, the insulative coating 1 is formed. Other than a polyimide resin, another insulative resin, such as phenol, epoxy and polyimide, can be used for the insulative coating 11.

Further, in order to improve the heat conductivity and to match the thermal expansion coefficient with other members of the insulative coating 11, an inorganic material, such as alumina and silica, can be mixed into the insulative resin as a filler. After forming the insulative coating, the adhesive layer 2 is formed on one surface of the heat radiation plate 3, and, thereafter, the same is adhered to the lead frame 1, to thereby obtain a lead frame with a heat radiation plate. Assembly of the semiconductor device thereafter is performed according to conventional processes.

Humidity Resistance Evaluation Result

FIG. 7 shows results of an evaluation involving a PCT (Pressure Cooker Test) performed for evaluating humidity resistance. The test condition of the PCT was 121°/100% RH/2 atm.

As shown in FIG. 7, with regard to the comparative example on a conventional HQFP, about 200 hours after the PCT was started, a peeling off was caused (first problem), and a shorting between leads and between a lead and the heat radiation plate was caused (second problem). In contrast thereto, according to the embodiments 1–14, a good result was obtained, in that the shorting is rarely caused, or is never caused, in comparison with the comparative example. Now, the respective humidity resistance evaluation results of the embodiments 1–14 will be discussed in more detail.

With regard to embodiments 1 and 2, a peeling off was caused about 200 hours after the PCT was started, like the comparative example. However, no migration between leads was caused. Although, since the heat radiation plate end portion 3a was not coated, a migration between a lead and the heat radiation plate was caused about 300 hours after the start of the PCT.

With regard to embodiments 3 and 4, a peeling off was also caused about 200 hours after the PCT was started, like the comparative example. Further, since no coating was applied over the lead frame, a migration between leads was caused like the comparative example. However, a migration between a lead and the heat radiation plate was reduced in comparison with the comparative example; although, migration can not be completely prevented.

With regard to embodiment 5, a peeling off was caused about 200 hours after the PCT was started, like the comparative example. However, no migration between leads and between a lead and the heat radiation plate was caused.

With regard to embodiments 6 through 8, a peeling off was caused about 200 hours after the PCT was started, like the comparative example. However, since the concerned portions of the lead frame were coated by one of platinum, rhodium and palladium, which is hardly eluted by acidic water like gold, no migration was caused, no shorting between leads and between a lead and the heat radiation plate was caused.

As has been explained above, with the embodiments 1–8, the second problem was resolved.

With regard to embodiments 9 and 10, a peeling off was caused 300 hours after the PCT was started. Because the surface of the lead frame was coated by tin or zinc, it is considered that the adhesive force thereby with the adhesive was increased in comparison with that provided by copper. Further, even after a peeling off was caused, because tin exhibits a better anti-acid elution property than copper, and even though the zinc surface is corroded, the zinc is never eluted in a form of ions, so that no migration was induced and no shorting between leads and between a lead and the heat radiation plate was induced.

With regard to embodiments 11 and 12, no peeling off was caused 400 hours after the PCT was started. Because the surface of the lead frame was coated by chromium or nickel, it is considered that the adhesive force thereby with the adhesive was increased in comparison with that provided by copper. Further, even after a peeling off was caused, because the chromium and nickel are hardly eluted under an acidic water environment comparted to copper, no migration was induced and no shorting between leads and between a lead and the heat radiation plate was induced.

With regard to embodiment 13, no peeling off was caused 500 hours after the PCT was been started. Because the surface of the lead frame was coated by titanium, it is considered that the adhesive force thereby with the adhesive was increased in comparison with that provided by copper. Further, even after a peeling off was caused, because on the surface of the titanium there is a passivated coating, anti-acid resistance is formed which prevents elution thereof Therefore, no migration was induced and no shorting between leads and between a lead and the heat radiation plate was induced.

With regard to embodiment 14, a peeling off was caused 500 hours after the PCT was started. Although, 500 hours after PCT was started a slight peeling off of the sample was caused, the peeling off was induced between the insulative coating 11 made of polyimide resin and the adhesive layer, but no peeling off between the lead frame 1 and the insulative coating 11 and between the heat radiation plate 3 and the insulative coating 11 was induced. It is considered that the adhesive force of the insulative coating 11 is high, which is formed by coating polyimide resin vanish over a metal, such as copper, and by drying the same. Therefore, no migration was induced and no shorting between leads and between a lead and the heat radiation plate was induced.

As has been explained above, with the embodiments 9 through 14, the first problem as well as the second problem can be resolved.

Embodiment 15

Figure 11:
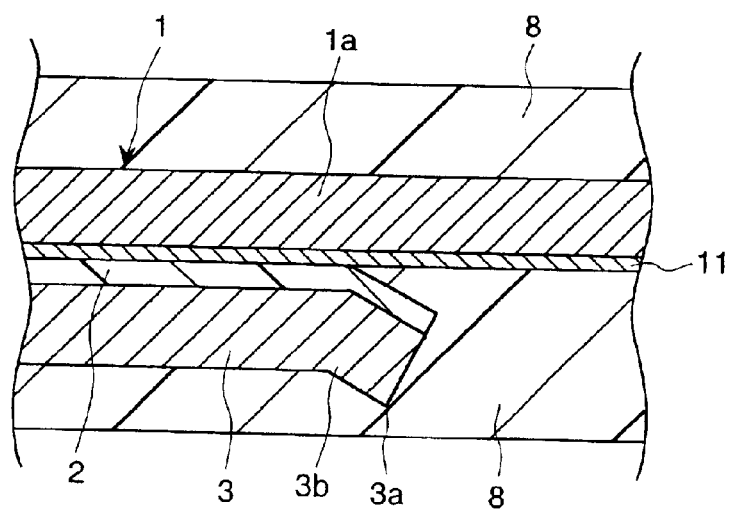
FIG. 11 is an enlarged partial cross-sectional view showing an example of a semiconductor device (HQFP) representing embodiment 15 of the present invention.

FIG. 11 is an enlarged cross-section of the D portion in FIG. 9, showing the structure of embodiment 15 of the present invention.

Namely, at the surrounding edge portion of the heat radiation plate, a bent portion 3a is formed, which is bent in a direction away from the inner lead 1a, the structure of which is combined with that of FIG. 1 (embodiment 1) and FIG. 2 (embodiment 2).

With such a combined structure, since there is a gap between the inner lead 1a and the heat radiation plate end portion 3a, a possible Cu migration generation between the lead and the heat radiation plate is prevented.

Namely, with the structures of FIGS. 1 and 2, although the amount of shorting between leads is zero, shorting between a lead and the heat radiation plate has occurred, as shown in the humidity resistance evaluation in FIG. 7; however, when the structure as shown in FIG. 11 is combined with the structure of either FIG. 1 or FIG. 2, the shorting between the lead and the heat radiation plate can be prevented with a simple structure.

Further, as the metallic coating 11 formed on the inner lead 11a, as has been explained in connection with the embodiments 1 through 15, when a combination of substrate nickel (Ni) plating and overall surface palladium plating is used, an armor plating or Ag plating at the top end of the inner lead can be omitted, whereby, the manufacturing process thereof can be simplified.

Figure 25:
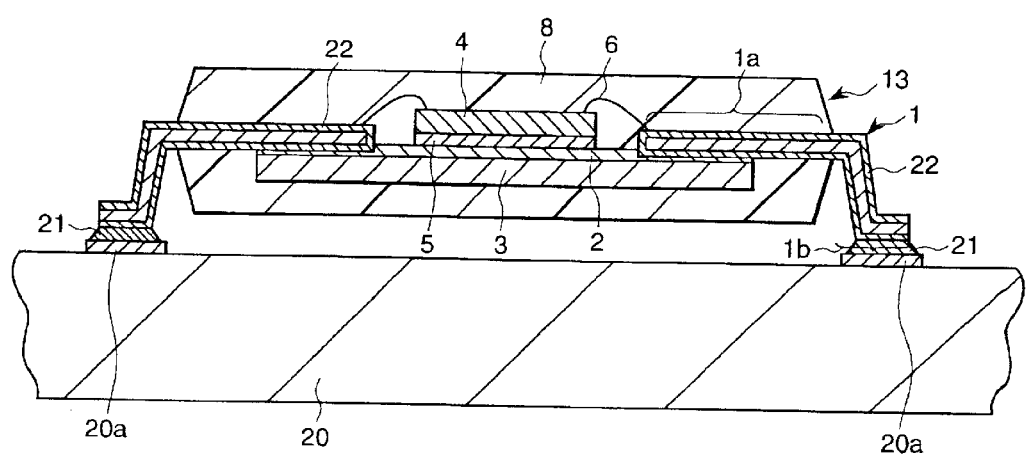
FIG. 25 is an enlarged partial cross sectional view showing an example of Pb free solder packaging by Pd plating over the entire lead surface of a semiconductor device (HQFP) according to the present invention.

Namely, as shown in FIG. 25, through the use of the Pd plating 22, the wettability of the leads with solder, which is used when actually packaging the HQFP 13 on a wiring substrate 20, can be ensured, whereby, the conventional armor plating process performed at the top end of the outer lead 1b can be omitted, and a structure (Pb free structure) can be realized which does not need to use Pb, which was used conventionally for the outer lead 1b.

In particular, when a Pb free semiconductor device is intended, as shown in FIG. 25, when the HQFP 13, which uses a lead frame 1 having an inner lead 1a and an outer lead 1b that are applied at the same time as the Pd plating, is packaged on the wiring substrate 20 by connecting the same to the substrate side terminals 20a via Pb free solder 21, migration prevention between Cu leads, as well as a Pb free semiconductor device, can be realized at the same time.

Further, through the use of Pd plating, the connectability of the portions on the inner leads 1a, where the metallic fine wires 6 are connected, is ensured, thereby, the conventional Ag plating 7 for connection with the metallic fine wires, which was performed for the inner leads 1a, can be omitted.

Further, when tin (Sn) plating is used for the metallic coating 11 formed on the inner leads 1a, it is possible to perform a wire bonding directly on the tin (Sn) plating after breaking the oxide film on the surface.

Accordingly, a metallic coating 11 serving as an armor plating can be formed, a process of omitting conventional armor plating can be achieved, and a Pb free process can be realized.

Embodiment 16

Figure 12:
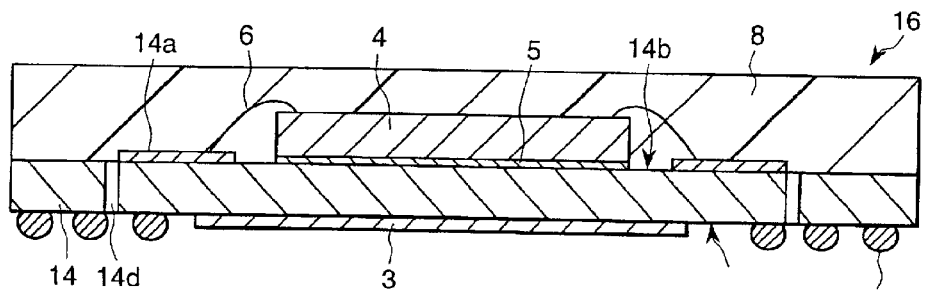
FIG. 12 is a cross-sectional view showing a BGA structure of a semiconductor device representing embodiment 16 of the present invention.

A semiconductor device representing embodiment 16 of the invention, as shown in FIG. 12, employs a BGA (Ball Grid Array) 16. This device is constituted by a wiring substrate 14 having a plurality of copper foil leads 14a; a semiconductor chip 4 that is disposed on a chip supporting face 14b of the wiring substrate 14; a plurality of metallic fine wires (a metallic bump can do) 6, which electrically connect the semiconductor chip 4 with respective copper foil leads 14a; a molding resin 8, which molds the semiconductor chip 4, the plurality of metallic fine wires 6 and the plurality of copper foil leads 14a; and, a plurality of ball electrodes (projection electrodes) 15, which are provided on a back face 14c at the side opposite to the face where the copper foil leads 14a of the wiring substrate 14 are formed. In addition, at least on portions of the copper foil leads 14c, which are covered by the molding resin 8, a metallic coating 11, for example, such as gold, is formed as shown in FIG. 16.

Figure 14:
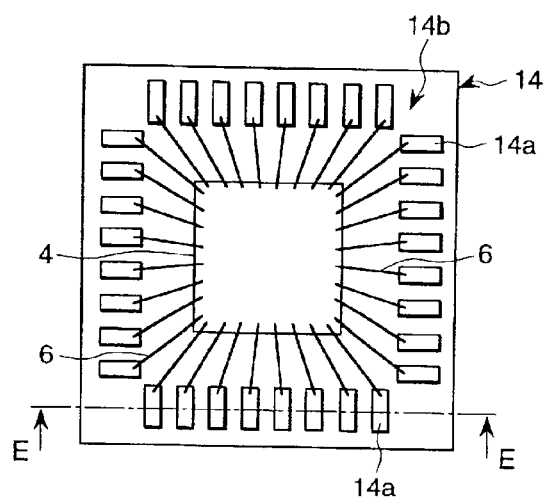
FIG. 14 is a sectional view showing the inner structure of the BGA shown in FIG. 12.
Figure 15:
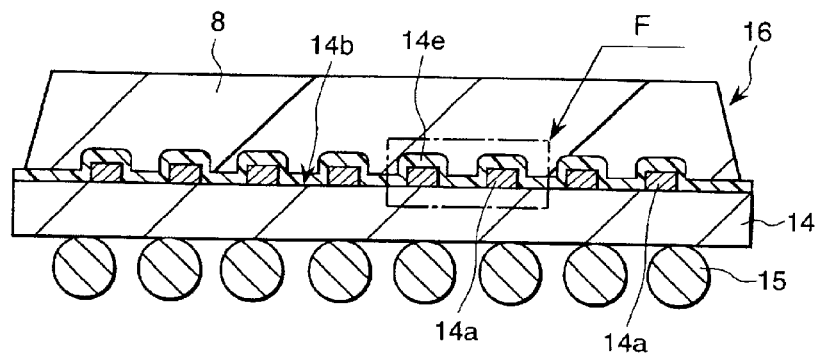
FIG. 15 is a cross-sectional view taken along E—E line in FIG. 14.

Namely, the BGA 16 of the present embodiment is structured in such a manner that, on the chip supporting surface 14b of the wiring substrate 14, a plurality of copper leads 14a are formed, as shown in FIGS. 14 and 15. Further, the respective copper foil leads 14a are covered by an insulative solder resist film 14e, except for the connecting region with the metallic fine wires 6; and, substantially the entire portion on the side of the chip supporting face 14b, including the copper foil leads 14a and the solder resist film 14e, is covered by the molding resin 8.

Figure 16:
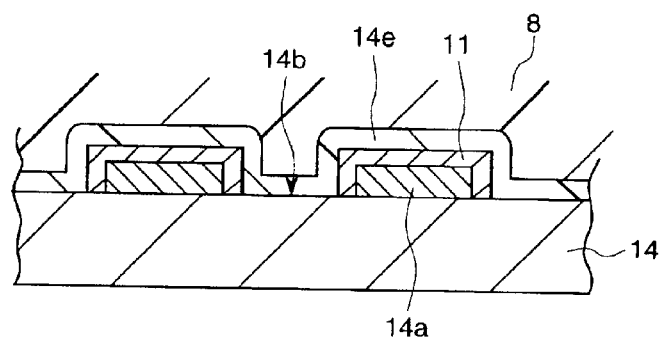
FIG. 16 is an enlarged partial cross-sectional view showing the F portion of the structure shown in FIG. 15.

Accordingly, the BGA 16 is structured in such a manner that, as shown in FIG. 16, each surface of the copper leads 14a is covered by respective separate metallic coatings 11, such as gold plating; and, on the upper layer thereof, an insulative solder resist film 14e and further, on the solder resist film 14e, the molding resin 8 is disposed.

Figure 13:
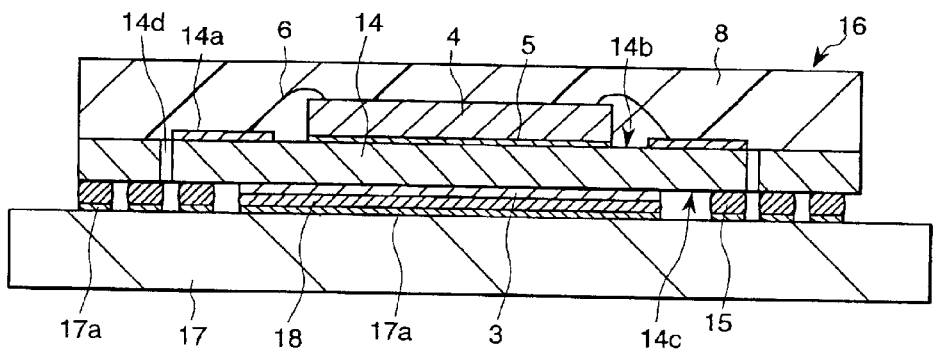
FIG. 13 is a cross-sectional view showing a packaged structure including the BGA shown in FIG. 12.

Further, the wiring substrate 14 is, for example, an epoxy resin substrate containing glass fibers and a BT (Bismalelmide triazine) substrate; and, as shown in FIG. 12, using through wiring passing through through-holes formed in the wiring substrate 14, the copper foil leads 14a disposed on the chip supporting face 14b are electrically connected to the ball electrodes 15 on the back face 14c thereof Further, FIG. 13 shows the packaging structure of the BGA 16 on the package substrate 17.

Since the BGA 16 is a high heat dissipation type semiconductor device in which the heat radiation plate 3 is attached on the back face 14c of the wiring substrate 14, the ball electrodes 15 contact the substrate side terminals 17a; and the heat radiation plate 3 contacts the substrate side terminals 17a via the solder junction portion 18, whereby, the heat dissipation property is enhanced.

According to the BGA 16 of embodiment 16, since the metallic coating 11 is formed on the surface of the copper foil leads 14, when the water content inside the substrate swells because of moisture absorption and a peeling off between the copper foil lead 14a and the solder resist film 14e or between the copper foil lead 14a and the molding resin 8, deposition of Cu ions can be prevented. Like the embodiments 1 through 15, with the present embodiment, the second problem, or both the first and second problems, can be resolved.

Embodiment 17

Figure 17:
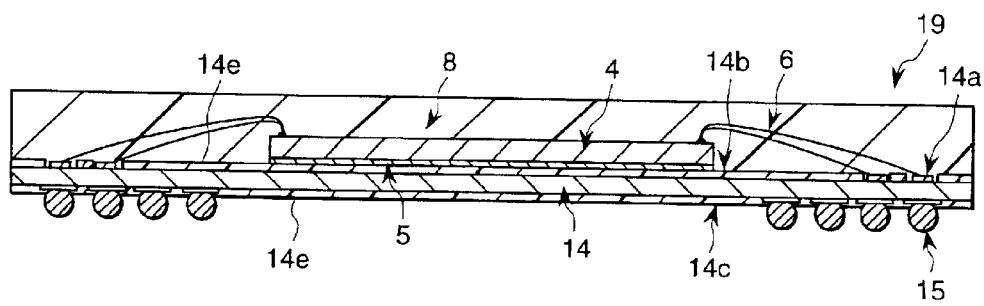
FIG. 17 is a cross-sectional view showing a BGA structure of a semiconductor device representing embodiment 17 of the present invention.
Figure 18:
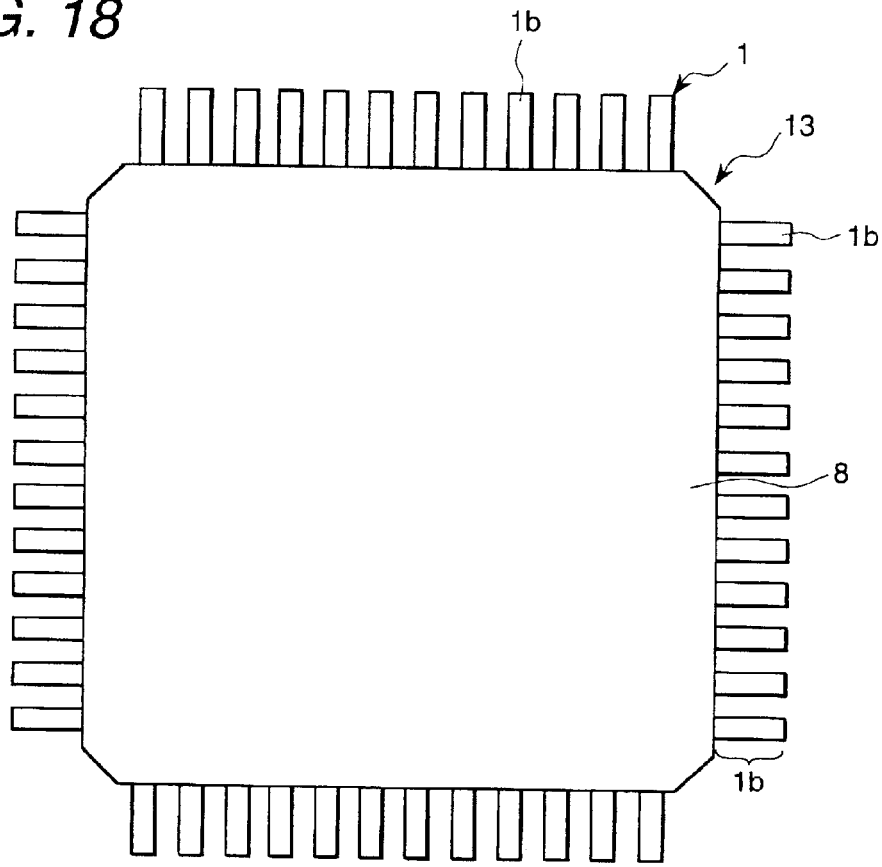
FIG. 18 is a top plan view of a semiconductor device (HQFP) using a conventional lead frame with a heat radiation plate.
Figure 19:
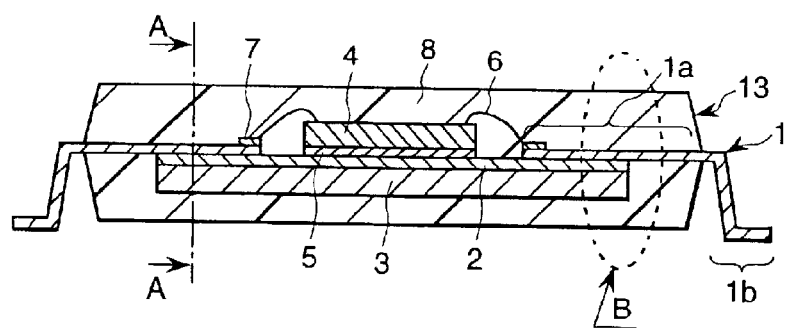
FIG. 19 is a cross-sectional view showing the structure of the semiconductor device (HQFP) using the conventional lead frame with a heat radiation plate.
Figure 20:
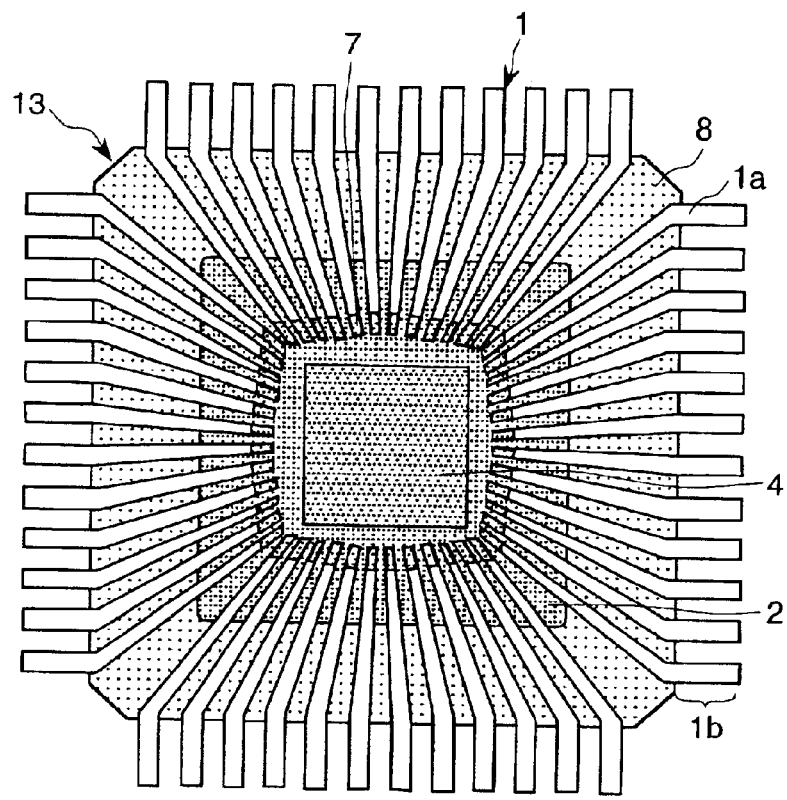
FIG. 20 is a section view showing the inner structure of the semiconductor device (HQFP) using the conventional lead frame with a heat radiation plate.

A semiconductor device representing embodiment 17 of the invention, as shown in FIG. 17, employs a small size BGA (Ball Grid Array) 19 and has a structure in which, as the wiring substrate 14, a tape substrate constituted by a thin film polyimide tape, for example, is used.

In the BGA 19, the metal coating 11, having the same structure as shown in FIG. 16, is formed on the surface of the copper foil leads 14a; therefore, like the embodiments 1–15, the second problem, or both the first and second problems, can be resolved.

Further, as materials of the metallic coating 11 formed on the inner leads 1a or the copper foil leads 14a, as has been explained in connection with embodiments 1–17, any metals which hardly cause Cu migration can be used.

Metals which are applicable to the present invention for forming the metallic coating 11 are ones having a higher reference electrode potential than copper (Cu), for example, such as gold (Au), platinum (Pt), iridium (Ir), rhodium (Rh), palladium (Pd) and silver (Ag), and at least one of these metals and their alloys can be used for the metallic coating 11.

Further, metals which form passivation films under acidic conditions can also be used, and examples of these are ruthenium (Ru), indium (In), tin (Sn), molybdenum (Mo), tungsten (Ta), gallium (Ga), zinc (Zn), chromium (Cr), niobium (Nb), tantalum (Ta), titanium (Ti), zirconium (Zr), osmium (Os) aluminum (Al), hafnium (Hf) and nickel (Ni), and at least one of these metals and their alloys can be used for the metallic coating 11.

Hitherto, embodiments invented by the inventors have been specifically explained with reference to the drawings, however, it is needless to say that the present invention should not be limited to the embodiments and can be modified in a variety of ways within a scope not exceeding the gist of the present invention.

For example, in the embodiments 1–15, a HQFP was described, however the applicable object of the present invention should not be limited to a HQFP type semiconductor device with a heat radiation plate having high thermal conductivity in view of the heat dissipation property of the semiconductor device. For example, the present invention is applicable to a QFP type semiconductor device with a substrate, in which, when the width of an inner lead top end becomes fine in association with an increase in the number of pins and a reduction in the pitch size, the mechanical strength of the top and of the inner lead during the resin molding process is ensured by securing the top end of the inner leads on the substrate.

For the above-described structure, the migration countermeasure to Cu leads of the present invention can be applied when there is a thermal expansion coefficient difference between the substrate and the molding resin, and when a peeling off at the boundary between the substrate and the molding resin is possibly caused due to such difference.

Typical advantages of the present invention as disclosed above will be briefly explained.

Since the surface of the inner leads which are joined to the heat radiation plate via the adhesive layer and the surface of the heat radiation plate are coated by a metallic coating, such as gold, the adhesive strength between the inner leads and the adhesive layer, the inner leads and the molding resin and the heat radiation plate and the molding resin is increased, whereby the generation rate of peeling and cracks can be reduced when the device is subjected to a PCT. Further, even when peeling and cracks are caused, since the surfaces of the inner leads and the heat radiation plate at the peeling off boundary are coated by a metallic coating, such as gold and other materials, or by an insulation coating, the migration of copper or copper alloy can be prevented, whereby a highly reliable semiconductor device free from leakage and shorting problems can be obtained Further, because no migration occurs, a high density semiconductor device with microscopic lead pitch can be obtained.

What is claimed is:

1. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein the inner leads are selectively covered by a metal having a higher reference electrode potential than that of copper such that portions of the inner leads which join with the adhesive layer are covered by said metal and other portions of the inner leads which are not joined with the adhesive layer are not covered with said metal.

2. A semiconductor device of claim 1, wherein the metals having higher reference electrode potential than that of copper are at least one among the group consisting of gold, platinum, iridium, rhodium, palladium and silver or an alloy thereof.

3. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein an end portion of the heat radiation plate is covered by a metal, formed between the end portion and the molding resin, having higher reference electrode potential than that of copper to reduce ion migration from the heat radiation plate to the inner leads.

4. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein an end portion of the heat radiation plate is covered by a metal having higher reference electrode potential than that of copper and wherein the inner leads are selectively covered by said metal, such that portions of the inner leads which join with the adhesive layer are covered by said metal and other portions of the inner leads which are not joined with the adhesive layer are not covered with said metal.

5. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein the inner leads are selectively covered by a metal which forms a passivation film under acidic condition such that portions of the inner leads which join with the adhesive layer are covered by said metal and other portions of the inner leads which are not joined with the adhesive layer are not covered with said metal.

6. A semiconductor device of claim 5, wherein the metals which form a passivation film under acidic condition are at least one among ruthenium, indium, tin, molybdenum, tungsten, gallium, zinc, chromium, niobium, tantalum, titanium, zirconium, osmium, aluminum, hafnium and nickel or an alloy thereof.

7. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein an end portion of the heat radiation plate is covered by a metal, formed between the end portion and the molding resin, which forms a passivation film under acidic condition to reduce ion migration from the heat radiation plate to the inner leads.

8. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively; and a molding resin which molds the semiconductor chip, the plurality of metallic fine wires and the heat radiation plate, wherein an end portion of the heat radiation plate is covered by a metal which forms a passivation film under acidic condition, and wherein the inner leads are selectively covered by said metal, such that portions of the inner leads which join with the adhesive layer are covered by said metal and other portions of the inner leads which are not coined with the adhesive layer are not covered with said metal.

9. A semiconductor device of claim 1, wherein around the circumferential edge portion of the heat radiation plate a bent portion is formed which is bent in a direction separating away from the inner leads.

10. A semiconductor device of claim 5, wherein around the circumferential edge portion of the heat dissipation plate a bent portion is formed which is bent in a direction separating away from the inner leads.

11. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fine wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that the lead frame is selectively covered by at least one metal or alloy different from the, metallic fine wire connecting use plating selected from the group consisting of gold, platinum, iridium, rhodium, palladium, ruthenium, indium, tin, molybdenum, tungsten, gallium, zinc, chromium, niobium, tantalum, titanium and zirconium such that portions of the inner leads which join with the adhesive layer are covered by said metal or alloy and other portions of the inner leads which are not joined with the adhesive layer are not covered with said metal or alloy.

12. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fined wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that at least an end portion of the heat radiation plate is covered by at least one metal or alloy, formed between the end portion and the molding resin, selected from the group consisting of gold, platinum, iridium, rhodium, palladium, ruthenium, indium, tin, molybdenum, tungsten, gallium, zinc, chromium, niobium, tantalum, titanium and zirconium to reduce ion migration from said heat radiation plate to said inner leads.

13. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fine wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that at least an end portion of the heat radiation plate is covered by at least one metal or alloy different from the metallic fine wire, formed between the end portion and the molding resin, said metal or alloy being selected from the group consisting of gold, platinum, iridium, rhodium, palladium, ruthenium, indium, tin, molybdenum, tungsten, gallium, zinc, chromium, niobium, tantalum, titanium and zirconium, and wherein the lead frame is selectively covered by said metal or alloy such that portions of the inner leads which join with the adhesive layer are covered by said metal or alloy and other portions of the inner leads which are not joined with the adhesive layer are not covered with said metal or alloy.

14. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fine wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that at least the entire portion where the lead frame joins with the adhesive layer is covered by an insulative coating.

15. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fine wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that at least an end portion of the heat radiation plate is covered by an insulative coating.

16. A semiconductor device which is assembled by making use of a lead frame with a heat radiation plate in which the lead frame and the heat radiation plate comprised of copper or copper alloy are joined by an adhesive layer formed on a surface of the heat radiation plate and at least a part of the inner leads of the lead frame is applied with a plating for a metallic fine wire connection, comprising:

a semiconductor chip mounted on the heat radiation plate or on a die pad of the lead frame metallic fine wires which electrically connect the inner leads with the semiconductor chip and a molding resin which molds the semiconductor chip, characterized in that at least the entire portion where the lead frame joins with the adhesive layer and at least an end portion of the heat radiation plate are covered by an insulative coating.

17. A semiconductor device comprising:

a wiring substrate including a plurality of copper foil leads;

a semiconductor chip disposed on an upper portion of the wiring substrate;

a plurality metallic fine wires or metallic bumps which electrically connect the semiconductor chip with the respective plurality of copper foil leads; a molding resin which molds the semiconductor chip, the plurality of metallic wires or metallic bumps and the plurality of copper foil leads; and a plurality of projecting electrodes which are provided on a face of the wiring substrate opposite from the face where the plurality of copper foil leads are formed, characterized in that copper foil leads are selectively coated by a metal having higher reference electrode potential than that of copper such that portions of the copper foil leads which are covered by the molding resin are coated with said metal and other portions of the copper foil leads are not coated by said metal.

18. A semiconductor device of claim 17, wherein the metals having higher reference electrode potential than that of copper are at least one among the group consisting of gold, platinum, iridium, rhodium, palladium and silver or an alloy thereof.

19. A semiconductor device comprising:

a wiring substrate including a plurality of copper foil leads;

a semiconductor chip disposed on an upper portion of the wiring substrate;

a plurality metallic fine wires or metallic bumps which electrically connect the semiconductor chip with the respective plurality of copper foil leads; a molding resin which molds the semiconductor chip, the plurality of metallic wires or metallic bumps and the plurality of copper foil leads; and a plurality of projecting electrodes which are provided on a face of the wiring substrate opposite from the face where the plurality of copper foil leads are formed, characterized in that of the copper foil leads are selectively coated by a metal which forms a passivation film under acidic condition such that portions of the copper foil leads which are covered by the molding resin are coated with said metal and other portions of the copper foil leads are not coated by said metal.

20. A semiconductor device of claim 19, wherein the metals which form a passivation film under acidic condition are at least one among ruthenium, indium, tin, molybdenum, tungsten, gallium, zinc, chromium, niobium, tantalum, titanium, zirconium, osmium, aluminum, hafnium and nickel or an alloy thereof.

21. A semiconductor device according to claim 14, wherein the insulative coating comprises at least one among the group consisting of polyimide resin, phenol, epoxy and polyimide.

22. A semiconductor device according to claim 15, wherein the insulative coating comprises at least one among the group consisting of polyimide resin, phenol, epoxy and polyimide.

23. A semiconductor device according to claim 16, wherein the insulative coating comprises of at least one among the group consisting of polyimide resin, phenol, epoxy and polyamide.

24. A semiconductor device comprising a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively;

a molding resin which molds the semiconductor chip, the plurality of metallic fine wires and the heat radiation plate; and means for preventing ion migration between said inner leads by selectively coating said inner leads with a metal such that portions of the inner leads which join the adhesive layer are coated with said metal while other portions of the inner leads which do not join the adhesive layer are not covered by said metal.

25. A semiconductor device according to claim 24, wherein said metal has a higher reference electrode potential than that of copper.

26. A semiconductor device according to claim 24, wherein said metal forms a passivation film under acidic conditions.

27. A semiconductor device according to claim 14, wherein said insulative coating includes means for improving heat conduction.

28. A semiconductor device according to claim 27, wherein said means for improving heat conduction includes an inorganic material.

29. A semiconductor device according to claim 15, wherein said insulative coating includes means for improving heat conduction.

30. A semiconductor device according to claim 29, wherein said means for improving heat conduction includes an inorganic material.

31. A semiconductor device according to claim 16, wherein said insulative coating includes means for improving heat conduction.

32. A semiconductor device according to claim 31, wherein said means for improving heat conduction includes an inorganic material.

33. A semiconductor device according to claim 14, wherein said lead frame is selectively coated by said insulative coating such that portions of the inner leads which join with the adhesive layer are covered by said insulative coating and other portions of the inner leads which do not join with the adhesive layer are not covered with said insulative coating.

34. A semiconductor device according to claim 16, wherein said lead frame is selectively coated by said insulative coating such that portions of the inner leads which join with the adhesive layer are covered by said insulative coating and other portions of the inner leads which do not join with the adhesive layer are not covered with said insulative coating.

35. A semiconductor device comprising:

a semiconductor chip;

a plurality of inner leads which are comprised of copper or copper alloy and extend around the semiconductor chip;

a heat radiation plate which joins to one ends of the plurality of inner leads via an insulative adhesive layer and on which the semiconductor chip is mounted via the adhesive layer or an adhesive different from the adhesive layer;

a plurality of metallic fine wires which connect between the semiconductor chip and the plurality of inner leads respectively;

a molding resin which molds the semiconductor chip, the plurality of metallic fine wires and the heat radiation plate; and means for reducing ion migration between said inner leads and said heat radiation plate by coating an end portion of the heat radiating plate with a material that reduces ion migration.

36. A semiconductor device according to claim 35, wherein said material comprises a metal having a higher reference electrode potential than that of copper.

37. A semiconductor device according to claim 35, wherein said material comprises a metal which forms a passivation film under acidic conditions.

38. A semiconductor device according to claim 35, wherein said material comprises an insulative coating.

39. A semiconductor device according to claim 38, wherein said insulative coating includes means for improving heat conduction.

40. A semiconductor device according to claim 39, wherein said means for improving heat conduction comprises an inorganic material added to the insulative coating.

* * * * *